United States Patent
Crosnier et al.

(10) Patent No.: US 10,256,604 B2
(45) Date of Patent: Apr. 9, 2019

(54) ELECTRICALLY PUMPED PHOTONIC CRYSTAL NANOLASER

(71) Applicants: STMICROELECTRONICS (CROLLES 2) SAS, Crolles (FR); CENTRE NATIONAL DE LA RECHERCHE SCIENTIFIQUE, Paris (FR); UNIVERSITE PARIS DIDEROT, Paris (FR)

(72) Inventors: Guillaume Crosnier, Orsay (FR); Fabrice Raineri, Paris (FR); Rama Raj, Paris (FR); Paul Monnier, Saint-Fargeau Ponthierry (FR)

(73) Assignees: STMicroelectronics (Crolles 2) SAS, Crolles (FR); Centre National de la Recherche Scientifique, Paris (FR); Universite Paris Diderot, Paris (FR)

( * ) Notice: Subject to any disclaimer, the term of this patent is extended or adjusted under 35 U.S.C. 154(b) by 0 days.

(21) Appl. No.: 15/739,339

(22) PCT Filed: Jun. 26, 2015

(86) PCT No.: PCT/FR2015/051740
§ 371 (c)(1),
(2) Date: Dec. 22, 2017

(87) PCT Pub. No.: WO2016/207495
PCT Pub. Date: Dec. 29, 2016

(65) Prior Publication Data
US 2018/0175585 A1 Jun. 21, 2018

(51) Int. Cl.
*H01S 5/042* (2006.01)
*H01S 5/026* (2006.01)
(Continued)

(52) U.S. Cl.
CPC ............ *H01S 5/0425* (2013.01); *B82Y 20/00* (2013.01); *H01S 5/026* (2013.01); *H01S 5/0422* (2013.01);
(Continued)

(58) Field of Classification Search
CPC .... H01S 5/0425; H01S 5/34373; H01S 5/041; H01S 5/026; H01S 5/22; H01S 5/105;
(Continued)

(56) References Cited

U.S. PATENT DOCUMENTS 5,838,870 A * 11/1998 Soref ................. G02B 6/12004
385/131
7,248,615 B2 * 7/2007 Assefa ................... B82Y 20/00
372/92

(Continued)

OTHER PUBLICATIONS

Bazin Alexandre et al: "Design of Silica Encapsulated High-Q Photonic Crystal Nanobeam Cavity," Journal of Lightwave Technology, IEEE Service Center, New York, NY, US, vol. 32, No. 5, Mar. 1, 2014, pp. 952-958, XP011537190, ISSN: 0733-8724.

(Continued)

*Primary Examiner* — Yuanda Zhang
(74) *Attorney, Agent, or Firm* — Crowe & Dunlevy

(57) ABSTRACT

A semiconductor nanolaser includes a rib formed by a stack of layers, in which stack central layers (33, 34, 35) forming an assembly of quantum wells are placed between a lower layer (32) of a first conductivity type and an upper layer (36) of a second conductivity type. Holes (42) are drilled right through the thickness of the rib, wherein the lower layer includes first extensions (38, 40) that extend laterally on either side of the rib, and that are coated with first metallizations (42, 44) that are located a distance away from the rib. The stack includes second extensions (45, 46) that extend longitudinally beyond said rib, and that are coated with second metallizations (47, 48).

24 Claims, 2 Drawing Sheets

(51) Int. Cl.
*H01S 5/10* (2006.01)
*H01S 5/22* (2006.01)
*H01S 5/343* (2006.01)
*B82Y 20/00* (2011.01)

(52) U.S. Cl.
CPC ............ *H01S 5/105* (2013.01); *H01S 5/1067* (2013.01); *H01S 5/22* (2013.01); *H01S 5/34373* (2013.01); *G02F 2201/063* (2013.01); *G02F 2202/32* (2013.01); *H01S 5/1032* (2013.01)

(58) Field of Classification Search
CPC ................... H01S 5/0422; B82Y 20/00; G02F 2201/063; G02F 2202/32
See application file for complete search history.

(56) References Cited

U.S. PATENT DOCUMENTS 7,603,016 B1  10/2009  Soref
2008/0159679 A1*  7/2008  Sigalas .................. B82Y 20/00 385/2
2008/0273832 A1*  11/2008  Kiyota ................... B82Y 20/00 385/14
2012/0106583 A1*  5/2012  Watson ................. H01S 5/1231 372/46.012

OTHER PUBLICATIONS

Guang-Hua Duan et al: "Hybrid III-V on Silicon Lasers for Photonic Integrated Circuits on Silicon," IEEE Journal of Selected Topics in Quantum Electronics, vol. 20, No. 4, Jul. 1, 2014, pp. 158-170, XP055198161, ISSN: 1077-260X.

International Search Report and Written Opinion for PCT/FR2015/051740 dated Mar. 3, 2016 (12 pages).

Y. Halioua et al: "Hybrid III-V Semiconductor/Silicon Nanolaser," Optics Express, vol. 19, No. 10, May 9, 2011, pp. 9221, XP055250887, ISSN: 2161-2072.

English Translation of PCT Written Opinon of the International Search Authority for PCT/FR2015/051740 dated Mar. 3, 2016 (6 pages).

* cited by examiner

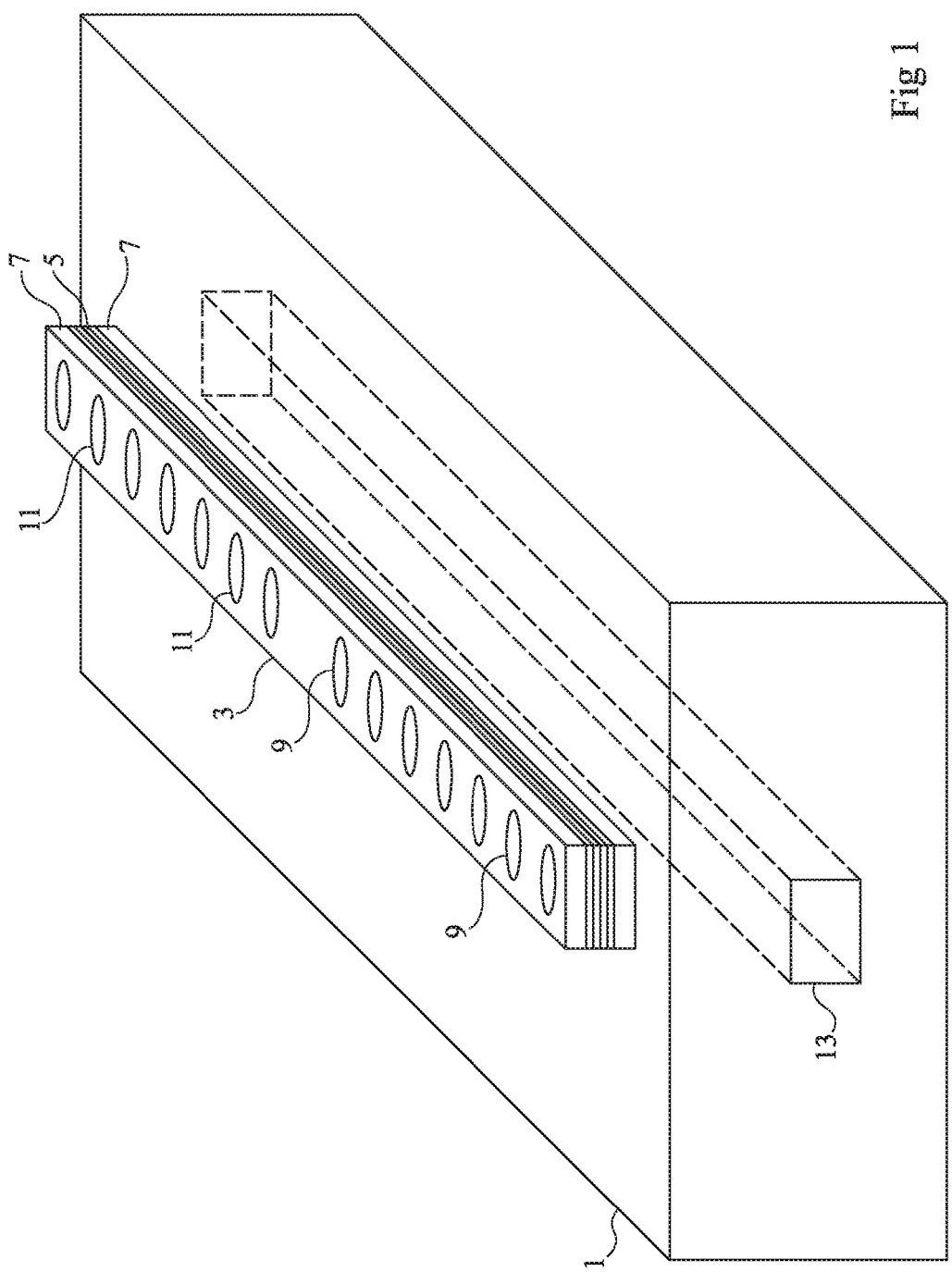

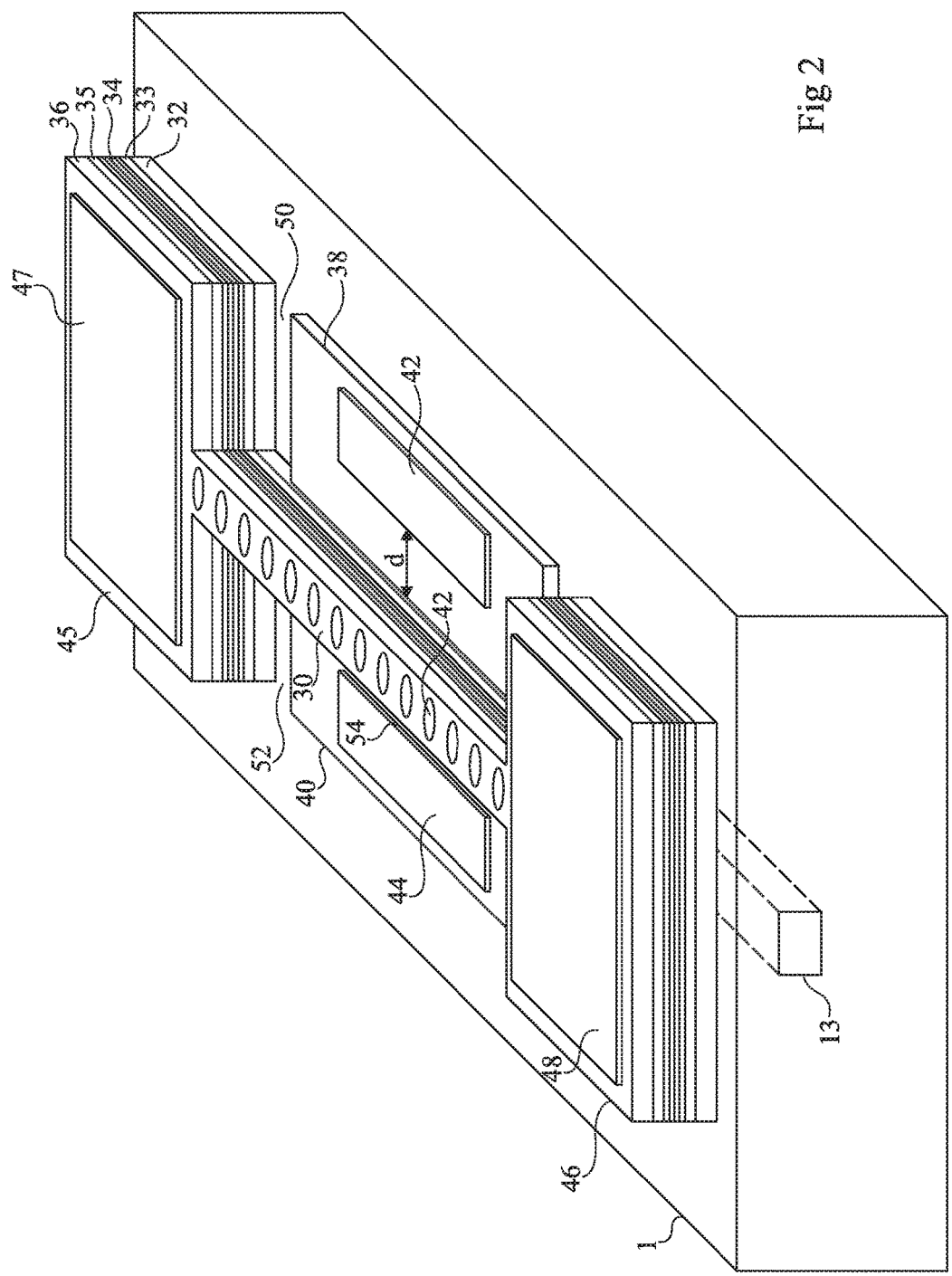

ELECTRICALLY PUMPED PHOTONIC CRYSTAL NANOLASER

CROSS REFERENCE TO RELATED APPLICATIONS

This application is a 371 filing from PCT/FR2015/051740 filed Jun. 26, 2015, the disclosures of which are incorporated by reference.

BACKGROUND

The present application relates to a laser of submicrometer dimensions, or nanolaser, having its light source formed from an electrically pumped direct bandgap semiconductor.

DISCUSSION OF THE RELATED ART

FIG. 1 is a simplified representation of an optically-pumped nanolaser having its structure described in Y. Halioua et al.'s article, "Hybrid III-V semiconductor-silicon nanolaser", published in Optics Express vol. 19, No 10, May 9, 2011 (incorporated by reference).

The nanolaser comprises, on a support 1, a rib 3 formed of a stack of successive layers. Rib 3 comprises alternated layers 5 of indium gallium arsenide, InGaAs, and of indium gallium arsenide phosphide, InGaAsP, placed between InGaAsP layers 7. The stack is formed so that the indium gallium arsenide layers form quantum wells.

Rib 3 is pierced, through its entire thickness, with two series of holes 9, 11 aligned along the longitudinal axis of the rib with a regular pitch. The spacings and the diameters of the holes are provided so that each series of holes forms a mirror of high reflectivity. Rib 3 thus forms a photonic crystal.

When rib 3 is illuminated by a light of appropriate wavelength, an optical pumping of the quantum wells may be carried out, and a laser amplification appears inside of the rib. An evanescent portion of the laser wave is captured by an optical guide 13 present in support 1 under the rib and parallel thereto.

A disadvantage is that an optical pumping is difficult to implement and to use.

SUMMARY

An embodiment provides a nanolaser with an electric pumping of quantum wells comprised in a rib forming a photonic crystal.

An embodiment provides a nanolaser with semiconductors comprising a rib comprising a stack of layers where central layers forming an assembly of quantum wells are arranged between a lower layer of a first conductivity type and an upper layer of a second conductivity type, holes being pierced through the entire rib thickness, wherein the lower layer comprises first extensions which extend laterally on either side of the rib and which are coated with first metallizations distant from the rib; and the stack comprises second extensions which extend longitudinally beyond said rib, and which are coated with second metallizations.

According to an embodiment, the second extensions have a decreased thickness as compared with the rest of the lower layer.

According to an embodiment, the distance between the first metallizations and the base of the rib is in the order of the wavelength divided by the refraction index of the material covering the metallization.

According to an embodiment, the rib successively comprises:
a lower layer of a P-type doped III-V semiconductor;
a stack of layers of III-V semiconductors, of different bandgaps, which form quantum wells; and
an upper layer of an N-type doped III-V semiconductor.

According to an embodiment, the rib successively comprises:
a lower layer of indium gallium arsenide phosphide, InGaAsP, P-type doped, having gallium forming from 0 to 40% of its cations and phosphorus forming from 0 to 60% of its anions, for example, $In_{0.8}Ga_{0.2}As_{0.45}P_{0.55}$, doped with zinc atoms at $10^{18}$ atoms/cm$^3$;
an intrinsic InGaAsP layer, having gallium forming from 0 to 40% of its cations and phosphorus forming from 0 to 60% of its anions, for example, $In_{0.84}Ga_{0.16}As_{0.48}P_{0.52}$;
a stack of layers of a first composition of InGaAsP separated by InGaAsP layers of a second composition, formed so that the InGaAsP layers of the first composition form quantum wells;
an intrinsic InGaAsP layer, having gallium forming from 0 to 40% of its cations and phosphorus forming from 0 to 60% of its anions, for example, $In_{0.84}Ga_{0.16}As_{0.48}P_{0.52}$; and
an upper indium phosphide layer 36 N-type doped with silicon atoms at $10^{18}$ atoms/cm$^3$,
wherein the first composition of the stack being such that gallium forms from 0 to 40% of the cations and phosphorus forms from 25 to 75% of anions, for example, $In_{0.84}Ga_{0.16}As_{0.76}P_{0.24}$, and the second composition being such that gallium forms from 5 to 40% of the cations and phosphorus forms from 0 to 60% of the anions, for example, $In_{0.84}Ga_{0.16}As_{0.48}P_{0.52}$.

According to an embodiment, the rib successively comprises:
a lower layer of indium gallium arsenide phosphide, InGaAsP, P-type doped, having a thickness in the range from 50 to 250 nm, preferably from 100 to 150 nm, for example, 130 nm;
an intrinsic InGaAsP layer having a thickness in the range from 15 to 100 nm, preferably from 15 to 60 nm, for example, 40 nm;
a stack of layers of a first composition of InGaAsP separated by InGaAsP layers of a second composition, the layers of the first composition having a thickness in the range from 4 to 12 nm, for example, 6.5 nm, and the layers of the second composition having thicknesses in the range from 10 to 50 nm, preferably from 10 to 20 nm, for example, 15 nm;
an intrinsic InGaAsP layer having a thickness in the range from 15 to 100 nm, preferably from 15 to 60 nm, for example, 40 nm;
an upper layer of N-type doped indium phosphide having a thickness in the range from 50 to 250 nm, preferably from 100 to 150 nm, for example, 150 nm.

An embodiment provides a structure comprising a nanolaser such as hereabove arranged on a silicon substrate having an optical guide configured to couple in operation with the nanolaser formed therein.

An embodiment provides a method of manufacturing a nanolaser such as hereabove, comprising the steps of assembling a III-V multilayer stack on a silicon substrate and of etching by photolithography said stack after assembly.

BRIEF DESCRIPTION OF THE DRAWINGS

The foregoing and other features and advantages will be discussed in detail in the following non-limiting description of specific embodiments in connection with the accompanying drawings, among which:

FIG. 1, previously described, schematically shows an optical pumping photonic crystal nanolaser; and FIG. 2 schematically shows an embodiment of an electric pumping photonic crystal nanolaser.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "high", "low", etc., or relative positions, such as terms "upper", "lower", etc., or to terms qualifying orientation, such as term "vertical", reference is made to the orientation of the drawings.

FIG. 2 shows an embodiment of an electric pumping photonic crystal nanolaser.

The nanolaser comprises, on a support 1 having its upper layer for example made of silicon oxide, a rib 30 formed by the multilayer structure. In this example, the structure successively comprises, from the support:

a lower layer 32 of indium gallium arsenide phosphide, InGaAsP, P-type doped, having gallium forming from 0 to 40% of its cations and phosphorus forming from 0 to 60% of its anions, for example, $In_{0.8}Ga_{0.2}As_{0.45}P_{0.55}$, doped by zinc atoms at $10^{18}$ atoms/cm$^3$;

an intrinsic InGaAsP layer 33, having gallium forming from 0 to 40% of its cations and phosphorus forming from 0 to 50% of its anions, for example, $In_{0.84}Ga_{0.16}As_{0.48}P_{0.52}$;

a stack 34 of layers of a first composition of InGaAsP separated by InGaAsP layers of a second composition, formed so that the InGaAsP layers of the first composition form quantum wells;

an intrinsic InGaAsP layer 35, having gallium forming from 0 to 40% of its cations and phosphorus forming from 0 to 60% of its anions, for example, $In_{0.84}Ga_{0.16}As_{0.48}P_{0.52}$; and an upper indium phosphide layer 36 N-type doped with silicon atoms at $10^{18}$ atoms/cm$^3$.

In the above example, the first composition of stack 34 is for example such that gallium forms from 0 to 40% of the cations and phosphorus forms from 25 to 75% of the anions, for example, $In_{0.84}Ga_{0.16}As_{0.76}P_{0.24}$, and the second composition is such that gallium forms from 5 to 40% of the cations and phosphorus forms from 0 to 60% of the anions, for example, $In_{0.84}Ga_{0.16}As_{0.48}P_{0.52}$.

Layer 32 has, for example, a thickness in the range from 50 to 250 nm, preferably from 100 to 150 nm, for example, 130 nm. Layers 33 and 35 have thicknesses in the range from 15 to 100 nm, preferably from 15 to 60 nm, for example, 40 nm. The layers of the first composition of stack 34 have a thickness in the range from 4 to 12 nm, for example, 6.5 nm. The layers of the second composition of stack 34 have thicknesses in the range from 10 to 50 nm, preferably from 10 to 20 nm, for example, 15 nm. Layer 36 has a thickness in the range from 50 to 250 nm, preferably from 100 to 150 nm, for example, 150 nm.

Rib 30 forms an optical guide and is pierced with holes 42 through its entire thickness. The distribution of holes 42 enables to create a photonic crystal of the type described in relation with FIG. 1, where the spacing between holes has been optimized according to the method described in A. Bazin et al's article, "Design of Silica Encapsuled High-Q Photonic Crystal Nanobeam Cavity", published in Journal of Lightwave Technology, Vol 32, No 5, Mar. 1, 2014 (incorporated by reference).

P-type doped lower layer 32 comprises two lateral extensions 38, 40, on each side, at the level of a central portion of rib 30. Such extensions may have a thickness smaller by one third than half that of layer 32 of the rib. Each lateral extension 38, 40 is in contact with a lateral metallization 42, 44, for example, based on zinc and gold. The lateral metallizations are arranged on the lateral extensions symmetrically on either side of the rib.

A distance d is provided between each of lateral metallizations 42 and 44 and the base of rib 30. The selection of distance d is critical. Distance d should be large enough to limit the absorption of the electromagnetic wave present in rib 30 and thus to preserve the optical quality of the rib (the above-mentioned thickness decrease of extensions 38 and 40 takes part in this limitation). Distance d should be sufficiently small for the conduction between the metallizations and the active area of layer 32 to be sufficiently high. It is here provided to calculate the spatial distribution of the electromagnetic field in the rib and the lateral extensions to place the metallizations in areas where the amplitude of this field is small. This results in a distance d in the order of the wavelength of light, to within 20%, divided by the refraction index of the material covering the metallization.

The multilayer structure extends longitudinally, beyond each of the two ends of rib 30, in two longitudinal extensions 45, 46. Upper N-type doped layer 36 of the longitudinal extensions is in contact with upper metallizations 47, 48, for example, based on titanium and gold. Metallizations 47 and 48 are arranged on the extensions, respectively 45 and 46. In the shown example, the width of the longitudinal extensions, in the order of 25 µm to within 10%, is greater than the width of rib 30, which enables to decrease the contact resistance.

Portions 38, 40 of layer 32 are interrupted to avoid reaching the portion of layer 32 located under the longitudinal extensions, which defines spacings 50, 52 located on either side of the rib.

In operation, a current flows from lower metallizations 42 and 44 connected to a same potential to upper metallizations 47 and 48 connected to a same potential. Spacings 50, 52 contribute to channeling the current towards lower P-type doped layer 32 of rib 30. The current then vertically flows through the rib, and then reaches upper metallizations 47 and 48. The carriers radiatively recombine within stack 34, thus allowing a pumping within the quantum wells, and the optical quality of rib 30 enables a laser amplification to occur. A portion of the laser wave is captured by an optical guide 13 embedded in support 1 as described in relation with FIG. 1.

The nanolaser described in relation with FIG. 2 is formed from a multilayer structure placed on support 1 and is defined by successive plasma etchings.

A first etch step, across the entire thickness of the multilayer structure, enables to form holes 42, spacings 50, 52, and the contour of the entire rib 30 and of lateral extensions 38, 40 and longitudinal extensions 45, 46.

A second etch step, which leaves in place a limited thickness of lower layer 32, enables to complete rib 30, and to form lateral extensions 38, 40.

Metallizations 42, 44 and 47 and 48, are then formed, for example, by a lift off process.

Specific embodiments have been described. Various alterations and modifications will occur to those skilled in the art. In particular, although the described quantum well are formed by indium gallium arsenide layers comprised between indium gallium phosphorus arsenide layers, it should be clear to those skilled in the art that other semiconductors with a direct bandgap may be selected, for example, from among III-V semiconductors.

Although the N- and P-type dopings described herein are respectively based on silicon atoms and zinc atoms, it should be clear for those skilled in the art that other atoms may be used.

Although the metal contact have been described with specific compositions, it should be clear to those skilled in the art that other compositions, capable of forming electric contacts with the doped layers, are possible.

Although the described lower P-type layer has a direct contact with support 1, it should be clear for those skilled in the art that this contact may be obtained, for example, via an intrinsic indium phosphorus layer.

What is claimed:

1. A nanolaser with semiconductors, comprising:
   a rib having a stack of layers which include central layers forming an assembly of quantum wells arranged between a lower layer of a first conductivity type and an upper layer of a second conductivity type, said rib including a plurality of holes pierced through a thickness of the rib and arranged in a longitudinal direction between a first end of the rib and a second end of the rib;
   wherein said lower layer of the rib comprises first extensions which extend in a lateral direction from opposite sides of the rib and which are coated with first metallizations that are spaced apart from central layers of the rib, said lateral direction being perpendicular to the longitudinal direction; and
   wherein said upper layer of the rib comprises second extensions which extend in the longitudinal direction beyond the first and second ends of said rib and which are coated with second metallizations.

2. The nanolaser of claim 1, wherein the first extensions of the lower layer have a thickness which is less than a thickness of a remainder of the lower layer in said rib.

3. The nanolaser of claim 1, wherein a distance that said first metallizations are spaced apart from the central layers of the rib is in the order of a wavelength divided by a refraction index of a material covering the first metallizations.

4. The nanolaser of claim 1, wherein the stack of layers of said rib successively comprises:
   the lower layer of a P-type doped III-V semiconductor;
   the central layers formed by a stack of layers of III-V semiconductors, of different bandgaps; and
   the upper layer of an N-type doped III-V semiconductor.

5. The nanolaser of claim 1, further comprising a silicon substrate supporting the rib and having an optical guide configured to couple in operation with the nanolaser.

6. The nanolaser of claim 1, wherein the rib has a first width in the lateral direction, wherein each second extension has a second width in the lateral direction, and wherein the second width is greater than the first width.

7. A nanolaser with semiconductors,
   a rib having a stack of layers which include central layers forming an assembly of quantum wells arranged between a lower layer of a first conductivity type and an upper layer of a second conductivity type, said rib including a plurality of holes pierced through a thickness of the rib, wherein the stack of layers of said rib successively comprises:
   the lower layer of indium gallium arsenide phosphide, InGaAsP, P-type doped, having gallium forming from 0 to 40% of its cations and phosphorus forming from 0 to 60% of its anions, doped by zinc atoms at $10^{18}$ atoms/cm$^3$;
   a first intrinsic InGaAsP layer, having gallium forming from 0 to 40% of its cations and phosphorus forming from 0 to 60% of its anions;
   the central layers formed by layers of a first composition of InGaAsP separated by InGaAsP layers of a second composition, such that the InGaAsP layers of the first composition form the quantum wells;
   a second intrinsic InGaAsP layer, having gallium forming from 0 to 40% of its cations and phosphorus forming from 0 to 60% of its anions; and
   the upper layer of indium phosphide N-type doped with silicon atoms at $10^{18}$ atoms/cm$^3$;
   wherein said lower layer comprises first extensions which extend laterally on either side of the rib and which are coated with first metallizations that are spaced apart from the central layers of the rib; and
   wherein said upper layer comprises second extensions which extend longitudinally beyond either end of said rib and which are coated with second metallizations.

8. The nanolaser of claim 7, wherein the first composition has gallium from 0 to 40% of the cations and phosphorus from 25 to 75% of the anions.

9. The nanolaser of claim 8, wherein the first composition comprises $In_{0.84}Ga_{0.16}As_{0.76}P_{0.24}$.

10. The nanolaser of claim 7, wherein the second composition has gallium from 5 to 40% of the cations and phosphorus from 0 to 60% of the anions.

11. The nanolaser of claim 10, wherein the second composition comprises $In_{0.84}Ga_{0.16}As_{0.48}P_{0.52}$.

12. The nanolaser of claim 7, wherein the lower layer of indium gallium arsenide phosphide comprises $In_{0.8}Ga_{0.2}As_{0.45}P_{0.55}$.

13. The nanolaser of claim 7, wherein the first intrinsic InGaAsP layer comprises $In_{0.84}Ga_{0.16}As_{0.48}P_{0.52}$.

14. The nanolaser of claim 5, wherein the second intrinsic InGaAsP layer comprises $In_{0.84}Ga_{0.16}As_{0.48}P_{0.52}$.

15. A nanolaser with semiconductors,
   a rib having a stack of layers which include central layers forming an assembly of quantum wells arranged between a lower layer of a first conductivity type and an upper layer of a second conductivity type, said rib including a plurality of holes pierced through a thickness of the rib, wherein the stack of layers in the rib successively comprises:
   the lower layer of indium gallium arsenide phosphide, InGaAsP, P-type doped, having a thickness in a range from 50 to 250 nm;
   a first intrinsic InGaAsP layer having a thickness in the range from 15 to 100 nm;
   the central layer comprise InGaAsP layers of a first composition separated by InGaAsP layers of a second composition, the layers of the first composition having a thickness in the range from 4 to 12 nm and the layers of the second composition having thicknesses in a range from 10 to 50 nm;
   a second intrinsic InGaAsP layer having a thickness in a range from 15 to 100 nm; and
   the upper layer of N-type doped indium phosphide having a thickness in the range from 50 to 250 nm;

wherein said lower layer comprises first extensions which extend laterally on either side of the rib and which are coated with first metallizations that are spaced apart from the central layers of the rib; and wherein said upper layer comprises second extensions which extend longitudinally beyond either end of said rib and which are coated with second metallizations.

16. The nanolaser of claim 15, wherein the thickness of the lower layer of indium gallium arsenide phosphide is in a range of 100 to 150 nm.

17. The nanolaser of claim 15, wherein the thickness of each of the first and second intrinsic InGaAsP layers is in a range from 15 to 60 nm.

18. The nanolaser of claim 15, wherein the layers of the second composition have thicknesses in a range from 10 to 20 nm.

19. The nanolaser of claim 15, wherein the upper layer has a thickness in a range from 100 to 150 nm.

20. A nanolaser with semiconductors,
a rib having a stack of layers, said rib including a plurality of holes pierced through a thickness of the rib, wherein the stack of layers of said rib successively comprises:
a lower layer of indium gallium arsenide phosphide (InGaAsP), P-type doped;
a first intrinsic InGaAsP layer;
a plurality of central layers forming an assembly of quantum wells;
a second intrinsic InGaAsP layer; and
an upper layer of indium phosphide (InP), N-type doped;

wherein said lower layer comprises a first extension which extends laterally from a side of the rib and which is coated with a first metallization; and wherein said upper layer comprises a second extension which extends longitudinally beyond an end of said rib and which is coated with a second metallization.

21. The nanolaser of claim 20, wherein the plurality of central layers comprise layers of a first composition of InGaAsP separated by InGaAsP layers of a second composition, such that the InGaAsP layers of the first composition form the quantum wells.

22. The nanolaser of claim 20, wherein said lower layer has a first thickness in the rib and has a second thickness in the first extension, said second thickness being less than the first thickness.

23. The nanolaser of claim 20, wherein the rib has a first width, wherein said second extension has a second width, and wherein the second width is greater than the first width.

24. The nanolaser of claim 20, wherein a distance that said first metallization is spaced apart from the central layers of the rib is in the order of a wavelength divided by a refraction index of a material covering the first metallization.

* * * * *

UNITED STATES PATENT AND TRADEMARK OFFICE
CERTIFICATE OF CORRECTION

PATENT NO. : 10,256,604 B2
APPLICATION NO. : 15/739339
DATED : April 9, 2019
INVENTOR(S) : Guillaume Crosnier et al.

Page 1 of 1

It is certified that error appears in the above-identified patent and that said Letters Patent is hereby corrected as shown below:

In the Specification

Column 2, Line 12, replace [[$In_{08}Ga_{0,2}As_{0,45}P_{0,55}$,]] with -- $In_{0,8}Ga_{0,2}As_{0,45}P_{0,55}$, --

Signed and Sealed this
Third Day of December, 2019

Andrei Iancu
*Director of the United States Patent and Trademark Office*